US006571371B1

(12) United States Patent
Coss, Jr. et al.

(10) Patent No.: US 6,571,371 B1
(45) Date of Patent: May 27, 2003

(54) METHOD AND APPARATUS FOR USING LATENCY TIME AS A RUN-TO-RUN CONTROL PARAMETER

(75) Inventors: Elfido Coss, Jr., Austin, TX (US); Michael R. Conboy, Austin, TX (US); Bryce Hendrix, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 123 days.

(21) Appl. No.: 09/749,293

(22) Filed: Dec. 27, 2000

(51) Int. Cl.[7] .................. G06F 17/50; G06F 19/00; H01L 21/66; G06K 9/20; G06K 9/60
(52) U.S. Cl. .................. 716/4; 716/21; 700/109; 700/120; 700/121; 438/10; 438/17; 438/946; 382/145; 382/154
(58) Field of Search .................. 716/1–21; 700/96–110, 700/118–121; 438/5–18, 946–950; 382/141, 144–152, 154

(56) References Cited

U.S. PATENT DOCUMENTS

| | | | | |
|---|---|---|---|---|
| 3,845,286 A | * | 10/1974 | Aronstein et al. | 700/102 |
| 5,375,061 A | * | 12/1994 | Hara et al. | 700/101 |
| 5,408,405 A | * | 4/1995 | Mozumder et al. | 700/31 |
| 5,975,740 A | * | 11/1999 | Lin et al. | 700/99 |
| 6,304,999 B1 | * | 10/2001 | Toprac et al. | 716/4 |
| 6,405,144 B1 | * | 6/2002 | Toprac et al. | 702/84 |

OTHER PUBLICATIONS

Herrmann et al., "Evaluating the Impact of Process Changes on Cluster Tool Performance", IEEE Transactions on Semiconductor Manufacturing, vol. 13, No. 2, May 2000, pp. 181–192.*

Poolsup et al., "Cluster Tool Simulation Assists the System Design", Proceedings of Winter Simulation Conference, vol. 2, Dec. 10–13, 2000, pp. 1443–1448.*

Warnick et al., "Feedback Synchronization: A Relaxation of Tracking", Proceedings of the American Control Conference, vol. 4, Jun. 28–30, 2000, pp. 2824–2828.*

Schaper et al., "Control of MMST RTP: Repeatability, Uniformity, and Integration for Flexible Manufacturing", IEEE Transactions on Semiconductor Manufacturing, vol. 7, No. 2, May 1994, pp. 202–219.*

Lu et al., "Education in Semiconductor Manufacturing Processes Through Physically–based Simulation", Proceedings of 26th Annual Conference on Frontiers in Education Conference, Nov. 6–9, 1996, vol. 1, pp. 250–253.

Bond et al., "Use of Multiple Lithography Monitors in a Defect Control Strategy for High Volume Manufacturing", 1999 IEEE/SEMI Advanced Semiconductor Manufacturing Conference and Workshop, Sep. 8–10, 1999, pp. 265–269.

Lee et al., "Yield Analysis and Data Management Using Yield Manager/sup TM/", 1998 IEEE/SEMI Advanced Semiconductor Manufacturing Conference and Workshop, 23025 Sep. 1998, pp. 19–30.

* cited by examiner

Primary Examiner—Matthew Smith
Assistant Examiner—Phallaka Kik
(74) Attorney, Agent, or Firm—Williams, Morgan & Amerson, P.C.

(57) ABSTRACT

The present invention provides for a method and an apparatus for using a latency time period as a control input parameter. A manufacturing run of semiconductor devices is processed. Metrology data from the processed semiconductor devices is acquired. A latency analysis process is performed using the acquired metrology data. A feedback/feedforward modification process is performed in response to the latency analysis process.

30 Claims, 5 Drawing Sheets

METHOD AND APPARATUS FOR USING LATENCY TIME AS A RUN-TO-RUN CONTROL PARAMETER

BACKGROUND OF THE INVENTION

1. Field of the Invention

This invention relates generally to semiconductor manufacturing, and, more particularly, to a method and apparatus for using latency time between processes for improving wafer-to-wafer uniformity.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and, therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Among the factors that affect semiconductor device manufacturing are wafer-to-wafer variations that are caused by manufacturing problems that include effects of manufacturing tool variations, memory effects of manufacturing chambers, first-wafer effects, and the like. One of the process steps that are adversely affected by such factors is the photolithography overlay process. Overlay is one of several important steps in the photolithography area of semiconductor manufacturing. Overlay control involves measuring the misalignment between two successive patterned layers on the surface of a semiconductor device. Generally, minimization of misalignment errors is important to ensure that the multiple layers of the semiconductor devices are connected and functional. As technology facilitates smaller critical dimensions for semiconductor devices, the need for the reduction of misalignment errors increases dramatically.

Generally, photolithography engineers currently analyze the overlay errors a few times a month. The results from the analysis of the overlay errors are used to make updates to exposure tool settings manually. Some of the problems associated with the current methods include the fact that the exposure tool settings are only updated a few times a month. Furthermore, currently, the exposure tool updates are performed manually.

Generally, a set of processing steps is performed on a lot of wafers on a semiconductor manufacturing tool called an exposure tool or a stepper. The manufacturing tool communicates with a manufacturing framework or a network of processing modules. The manufacturing tool is generally connected to an equipment interface. The equipment interface is connected to a machine interface to which the stepper is connected, thereby facilitating communications between the stepper and the manufacturing framework. The machine interface can generally be part of an advanced process control (APC) system. The APC system initiates a control script, which can be a software program that automatically retrieves the data needed to execute a manufacturing process. The input parameters that control the manufacturing process are revised periodically in a manual fashion. As the need for higher precision manufacturing processes increases, improved methods are needed to revise input parameters that control manufacturing processes in a more automated and timely manner. Furthermore, wafer-to-wafer manufacturing variations can cause non-uniform quality of semiconductor devices. Latency time between manufacturing processes can cause non-uniform conditions for semiconductor wafers being processed, which can result in non-uniform quality.

The present invention is directed to overcoming, or at least reducing the effects of, one or more of the problems set forth above.

SUMMARY OF THE INVENTION

In one aspect of the present invention, a method is provided for using a latency time period as a control input parameter. A manufacturing run of semiconductor devices is processed. Metrology data from the processed semiconductor devices is acquired. A latency analysis process is performed using the acquired metrology data. A feedback/feed-forward modification process is performed in response to the latency analysis process.

In another aspect of the present invention, an apparatus is provided for using a latency time period as a control input parameter. The apparatus of the present invention comprises: a computer system; a manufacturing model coupled with said computer system, said manufacturing model being capable of generating and modifying at least one control input parameter signal; a machine interface coupled with said manufacturing model, said machine interface being capable of receiving process recipes from said manufacturing model; at least one processing tool capable of processing semiconductor wafers and coupled with said machine interface, said processing tool being capable of receiving at least one control input parameter signal from said machine interface; a metrology tool coupled with said processing tool, said metrology tool being capable of acquiring metrology data; a metrology data processing unit coupled with said metrology tool, said metrology data processing unit being capable of organizing said acquired metrology data; a latency calculator coupled with said metrology tool, said latency calculator being capable of calculating a latency time period between a plurality of semiconductor wafer manufacturing processes based upon said metrology data; and a feedback/feed-forward controller coupled with said latency calculator and said computer system, wherein said feedback/feed-forward controller is capable of generating feedback and feed-forward adjustment data and sending them to said computer system for modification of said control system parameters.

BRIEF DESCRIPTION OF THE DRAWINGS

The invention may be understood by reference to the following description taken in conjunction with the accompanying drawings, in which like reference numerals identify like elements, and in which.

Figure 1:
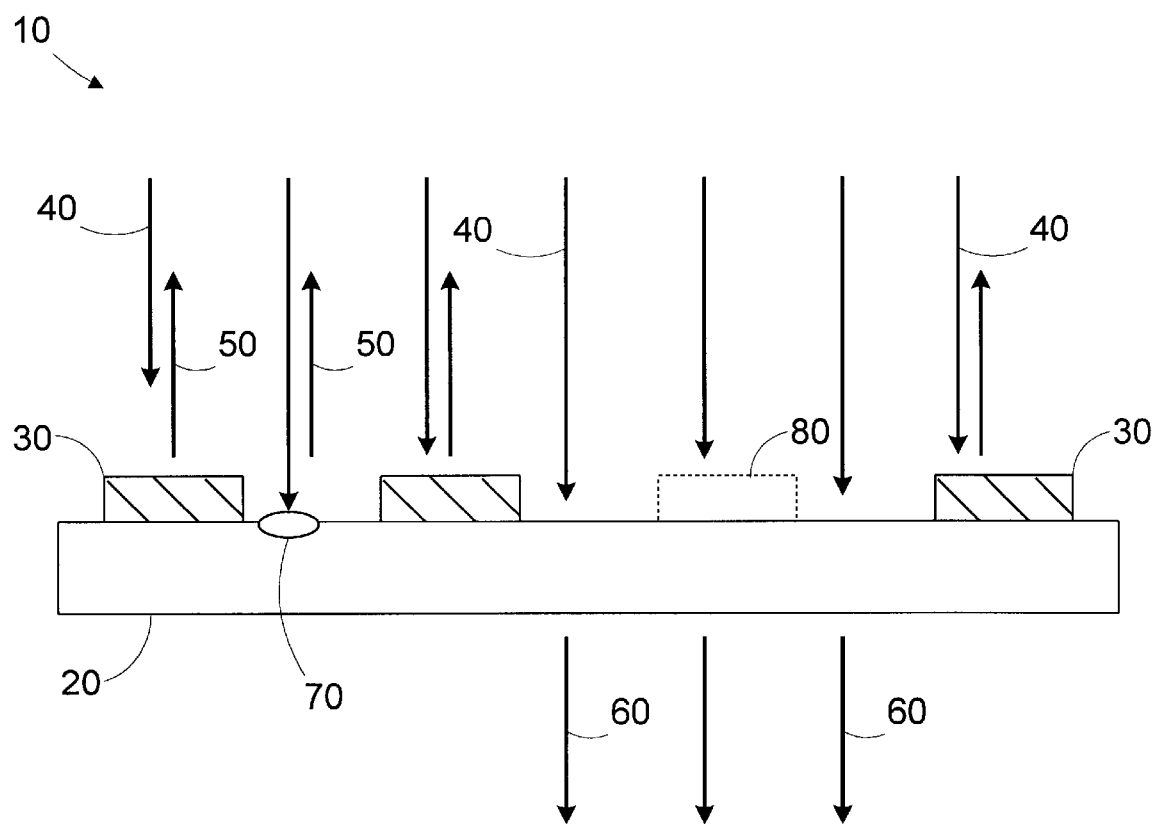
FIG. 1 illustrates one embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Wafer-to-wafer variations can result in an output of non-uniform semiconductor devices. One process that is affected is the photolithography overlay process. Overlay process is an important step in semiconductor manufacturing. In particular, overlay process involves measuring misalignment errors between semiconductor layers during manufacturing processes. Improvements in the overlay process could result in substantial enhancements, in terms of quality and efficiency, in semiconductor manufacturing processes. The present invention provides a method of implementing automated error correction for wafer-to-wafer variations.

Semiconductor devices are processed in a manufacturing environment using a number of input control parameters. Turning now to FIG. 1, one embodiment of the present invention is illustrated. In one embodiment, semiconductor products 105, such as semiconductor wafers, are processed on processing tools 110, 112 using a plurality of control input signals on a line 120. In one embodiment, the control input signals on the line 120 are sent to the processing tools 110, 112 from a computer system 130 via machine interfaces 115, 117. In one embodiment, the first and second machine interfaces 115, 117 are located outside the processing tools 110, 112. In an alternative embodiment, the first and second machine interfaces 115, 117 are located within the processing tools 110, 112.

In one embodiment, the computer system 130 sends control input signals on a line 120 to the first and second machine interfaces 115, 117. The computer system 130 employs a manufacturing model 140 to generate the control input signals on the line 120. In one embodiment, the manufacturing model 140 contains a recipe that determines a plurality of control input parameters that are sent on the line 120.

In one embodiment, the manufacturing model 140 defines a process script and input control that implement a particular manufacturing process. The control input signals on a line 120 that are intended for processing tool A110 are received and processed by the first machine interface 115. The control input signals on a line 120 that are intended for processing tool B112 are received and processed by the second machine interface 117. Examples of the processing tools 110, 112 used in semiconductor manufacturing processes are steppers, scanners, step-and-scan tools, and etch process tools. In one embodiment, processing tool A110 and processing tool B112 are photolithography process tools, such as steppers.

One or more of the semiconductor wafers that are processed by the processing tools 110, 112 are generally sent to a metrology tool 150 for acquisition of metrology data. In one embodiment, the metrology tool 150 is a scatterometry data acquisition tool, or a scatterometer. Data from the metrology tool 150 is processed and organized by the metrology data processing unit 145. In one embodiment, the metrology data processing unit 145 correlates the metrology data to a particular manufacturing lot of processed semiconductor wafers. In one embodiment, the metrology data processing unit 145 is integrated into the computer system 130. In one embodiment, the metrology data processing unit 145 is a computer software program embedded into the computer system 130, wherein the computer system 130 is integrated within the APC framework.

The processed metrology data from the metrology data processing unit 145 is sent to a latency calculator 158 on a line 155. In one embodiment, the latency calculator 158 determines the latency time between any two manufacturing processes. For example the latency calculator 158 calculates the latency time period between a first process performed by processing tool A110 and a second process performed by processing tool B112.

Latency data from the latency calculator 158 is sent to a feedback/feed-forward controller 160 on a line 159. In one embodiment, the feedback/feed-forward controller 160 processes the latency data and generates feedback and feed-forward adjustment data that are known by those skilled in the art. The feedback and feed-forward adjustment data, described below, is sent to the computer system 130 via a line 170. The computer system 130 utilizes the feedback and feed-forward adjustment data to make modifications in the manufacturing model 140, which causes appropriate changes in the control input parameters on the line 120. In one embodiment, the feedback/feed-forward controller 160 is integrated into the computer system 130. In one embodiment, the feedback/feed-forward controller 160 is a computer software program embedded into the computer system 130. In one embodiment, the feedback/feed-forward controller 160 causes the modification of control input parameters on a run-to-run basis. In other words, once a manufacturing run of semiconductor wafers is processed, the present invention provides a method of modifying control input parameters for a subsequent manufacturing run of semiconductor wafers.

Among the bases for modifying the control input signal on the line 120 are metrology measurements performed on processed semiconductor wafers, such as scatterometry measurements. The present invention provides a method for utilizing the latency time between two manufacturing processes as a basis for modifying the control input signal on the line 120. Furthermore, the present invention provides for a method for using the latency time as a control input parameter. In one embodiment, the latency time periods are used to perform a feedback modification and a feed-forward modification of the control input signals. Generally, the feedback modification of the control input signals on the line 120 are performed on photolithography processes, such as line-width adjustments using photo exposure dosages and line profile adjustments using exposure focus modifications. Feedback modification of the control input signals on the line 120 can also be performed on etch processes, such as etch line shape adjustments using etch recipe modifications.

Feed-forward modification of the control input signals on the line 120 can be used to perform corrections of subsequent processes on the semiconductor wafers. Feed-forward modification of the control input signals on the line 120 can be used in spacer deposition processes, where scatterometry techniques can be used to adjust effective line-widths of precision forms on semiconductor wafers. In one embodiment, in a spacer deposition process, scatterometry measurements can be used to adjust deposition time, which may impact the spacer width, which in turn would impact the effective line-width of a trace on a semiconductor wafer. Furthermore, scatterometry measurements can be used to measure the ion implantation parameters and adjust ion implant dosage on subsequent ion implant processes.

In the context of a manufacturing process, such as a stepper process, the control inputs on the line 120 that are used to operate the processing tool 110 include an x-translation signal, a y-translation signal, an x-expansion wafer scale signal, a y-expansion wafer scale signal, a reticle magnification signal, and a reticle rotation signal. Generally, errors associated with the reticle magnification signal and the reticle rotation signal relate to one particular exposure process on the surface of the wafer being processed in the exposure tool. One of the primary features taught by the present invention is a method of updating control input signals on the line 120 in response to an analysis of external variables.

When a process step in the processing tool 110 is concluded, the semiconductor wafer that is being processed in the processing tool 110 is examined in a review station. One such review station is a KLA review station. One set of data derived from the operation of the review station is a quantitative measure of the amount of misregistration that was caused by the previous exposure process. In one embodiment, the amount of misregistration relates to the misalignment in the process that occurred between two layers of a semiconductor wafer. In one embodiment, the amount of misregistration that occurred can be attributed to the control inputs to a particular exposure process. The control inputs generally affect the accuracy of the process steps performed by the exposure tools on the semiconductor wafer. The control input signals affect the reticle magnification and the position of the semiconductor wafer that is being processed. Modifications of the control inputs can be utilized to improve the performance of the process steps employed in the exposure tool. In one embodiment, the modifications to the control input signals on the line 120 are based on the effects of external variables on the semiconductor devices being processed.

Figure 2:
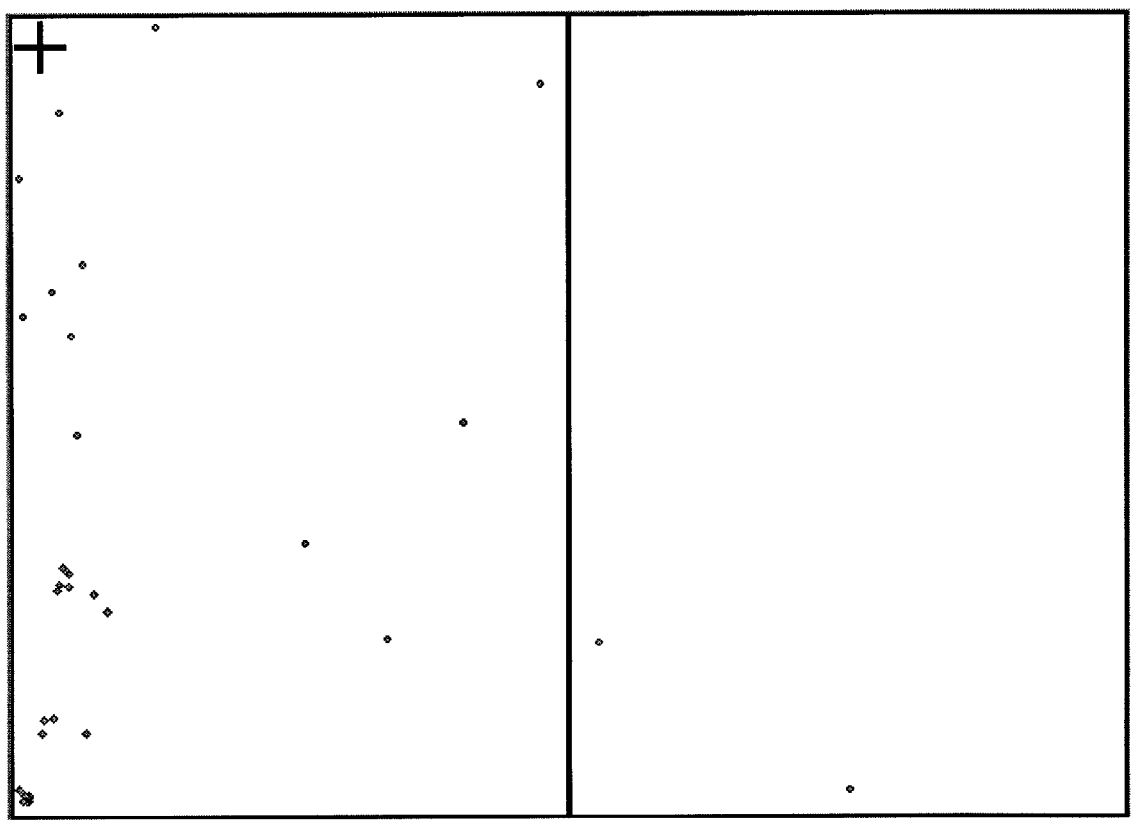
FIG. 2 illustrates one embodiment of using latency time between manufacturing processes as a control parameter.

Turning now to FIG. 2, one embodiment of an apparatus for performing the method taught by the present invention is shown. FIG. 2 illustrates a first process step 210, a second process step 220, a third process step 230 through an Nth process step 240. The latency calculator 158 calculates a latency time ($t_1$) between the first process step 210 and the second process step 220, as illustrated in FIG. 2. The latency time, $t_1$, is sent to the feedback/feed-forward controller 160. The feedback/feed-forward controller 160, in conjunction with the computer system 130 and the manufacturing model 140, utilizes the latency time, $t_1$, as a control input parameter. The latency time, $t_1$, is sent to the second through Nth process steps 220, 230, 240 to be used as a control input parameter for improving their respective processing quality.

An illustrative example of using the latency time, $t_1$, as a control parameter is provided below. In one embodiment, the second process step 220 is a photoresist material application process, where photoresist material is applied onto the surface of a semiconductor wafer. In order to obtain a minimum process quality, a process light exposure step must be implemented by the third process step 230 within a certain time period that is known by those skilled in the art. Therefore, the latency time, $t_1$, can be used as a factor to control the manufacturing process flow while processing the semiconductor wafers.

An alternative illustrative example of using the latency time, $t_1$, as a control parameter is provided below. In one embodiment, the second process step 220 is a wet cleaning process. If the semiconductor wafer is exposed a certain time period before the next process step is implemented, an undesirable oxidation effect may occur on the semiconductor-wafers. Therefore, the known latency time, $t_1$, can be used as a control parameter that controls the manufacturing process flow to prevent excessive delay that may cause oxidation on the semiconductor wafers. Furthermore, if oxidation has indeed occurred on the semiconductor wafer being processed, the latency time, $t_1$, can be used as a control parameter by the third process step 230 to determine the amount of cleaning to be performed on the semiconductor wafer. The amount of cleaning performed by the third process step 230 will be directly proportional to the latency time, ti. The latency time, $t_1$, can be used as a control parameter for other process steps that are known to those skilled in the art.

Figure 3:
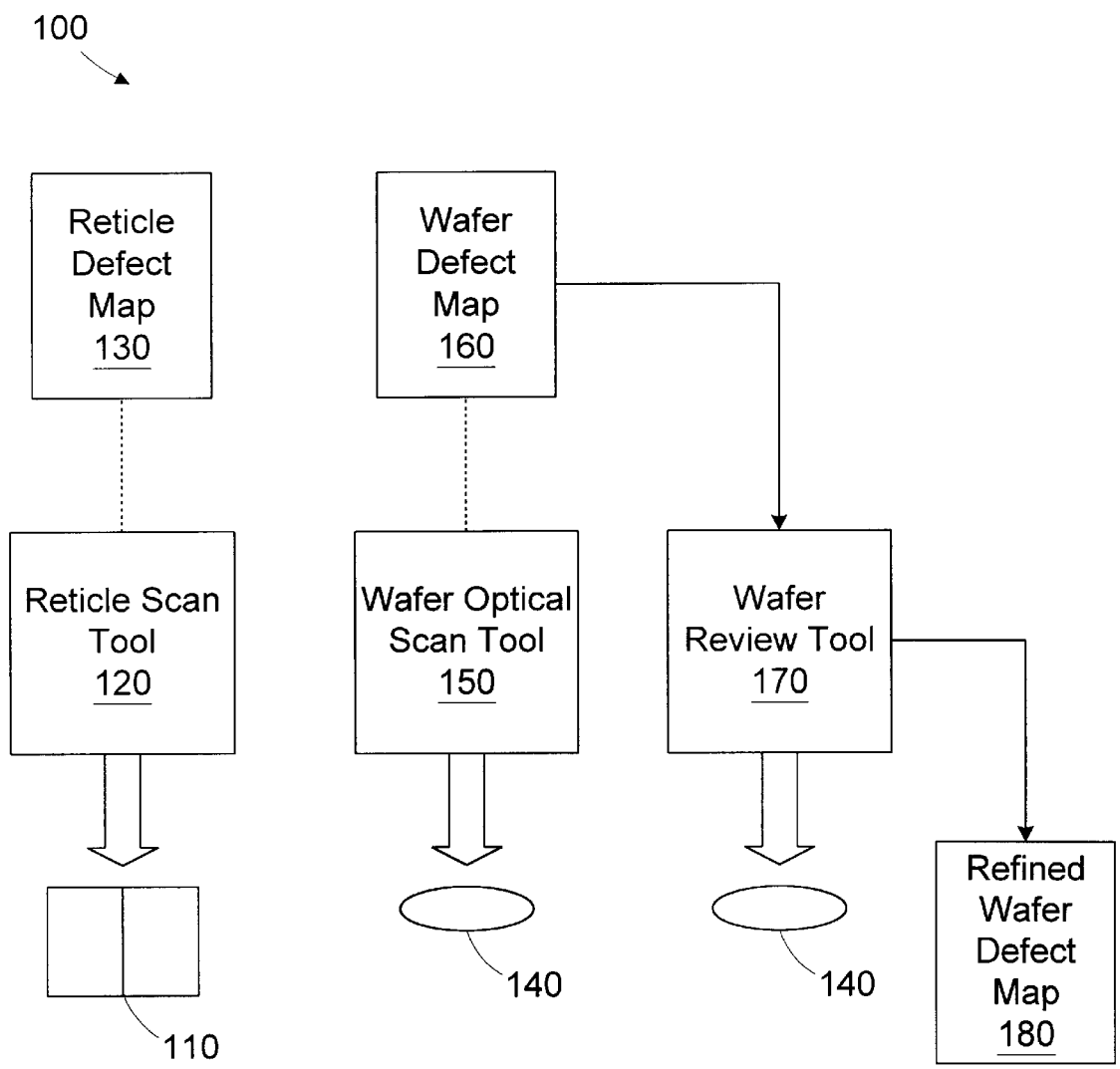
FIG. 3 depicts a flowchart representation of one embodiment of performing the methods taught by the present invention.

Turning now to FIG. 3, a flowchart depiction of the method of utilizing latency time between manufacturing process steps is illustrated. A sequence of at least one manufacturing run of semiconductor wafers is processed, as described in block 310 of FIG. 3. In one embodiment, the semiconductor wafers are processed by photolithography processing tools. Production data, or metrology data, from the semiconductor wafers is acquired and analyzed, as described in block 320 of Figure. In one embodiment, at least a sample of the processed semiconductor wafers is sent from the processing tools 110, 112 to the metrology tool 150. In one embodiment, the metrology data processing unit 145 collects and correlates the metrology data with specific semiconductor wafer lot number and manufacturing numbers.

Figure 4:
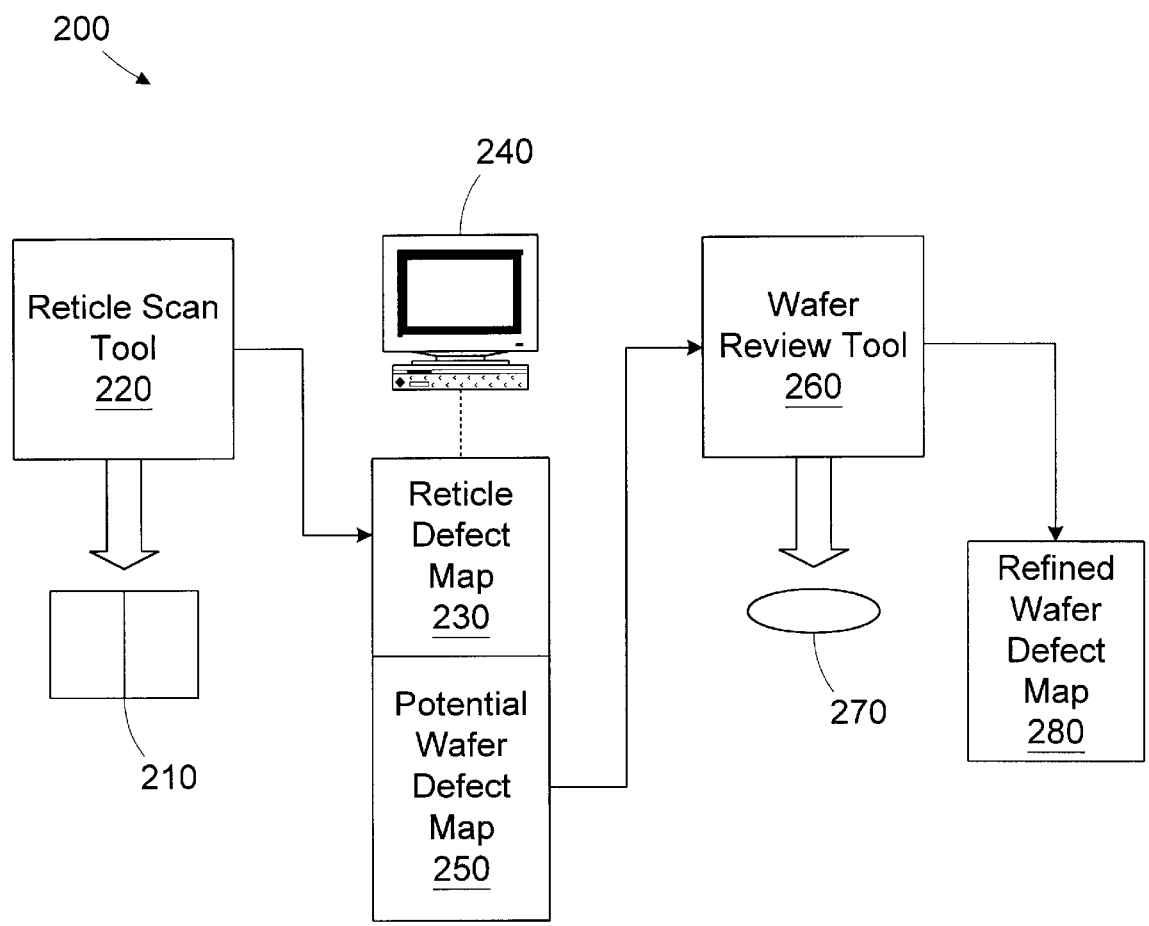
FIG. 4 illustrates, in further detail, a flowchart representation of one method of implementing the step of performing latency analysis.

Once the metrology data is acquired and analyzed, the organized metrology data is used to perform a latency analysis, as described in block 330 of FIG. 3. FIG. 4 illustrates a more detailed description of one embodiment of performing latency analysis. Turning now to FIG. 4, production data (metrology data) from at least two processing steps is collected and analyzed, as described in block 410. In one embodiment, the production data from the two process steps is collected by the latency calculator 158. The latency calculator 158 uses the production data from the two process steps to calculate the latency time between the two process steps, such as the latency time ($t_1$) between the first process step 210 and the second process step 220, as described in block 420 of FIG. 4.

Once the latency time between the two process steps is calculated, the latency time calculated by the latency calculator 158 is utilized as a control parameter, as described in block 430 of FIG. 4. The latency time between the two process steps is sent to a feedback/feed-forward controller 160 to be used as a control parameter. In one embodiment, the latency time is implemented into the manufacturing model 140, as described in block 440 of FIG. 4. The manufacturing model 140 then analyzes the production data associated with the two process steps and implements the latency time into the control input parameters.

Figure 5:
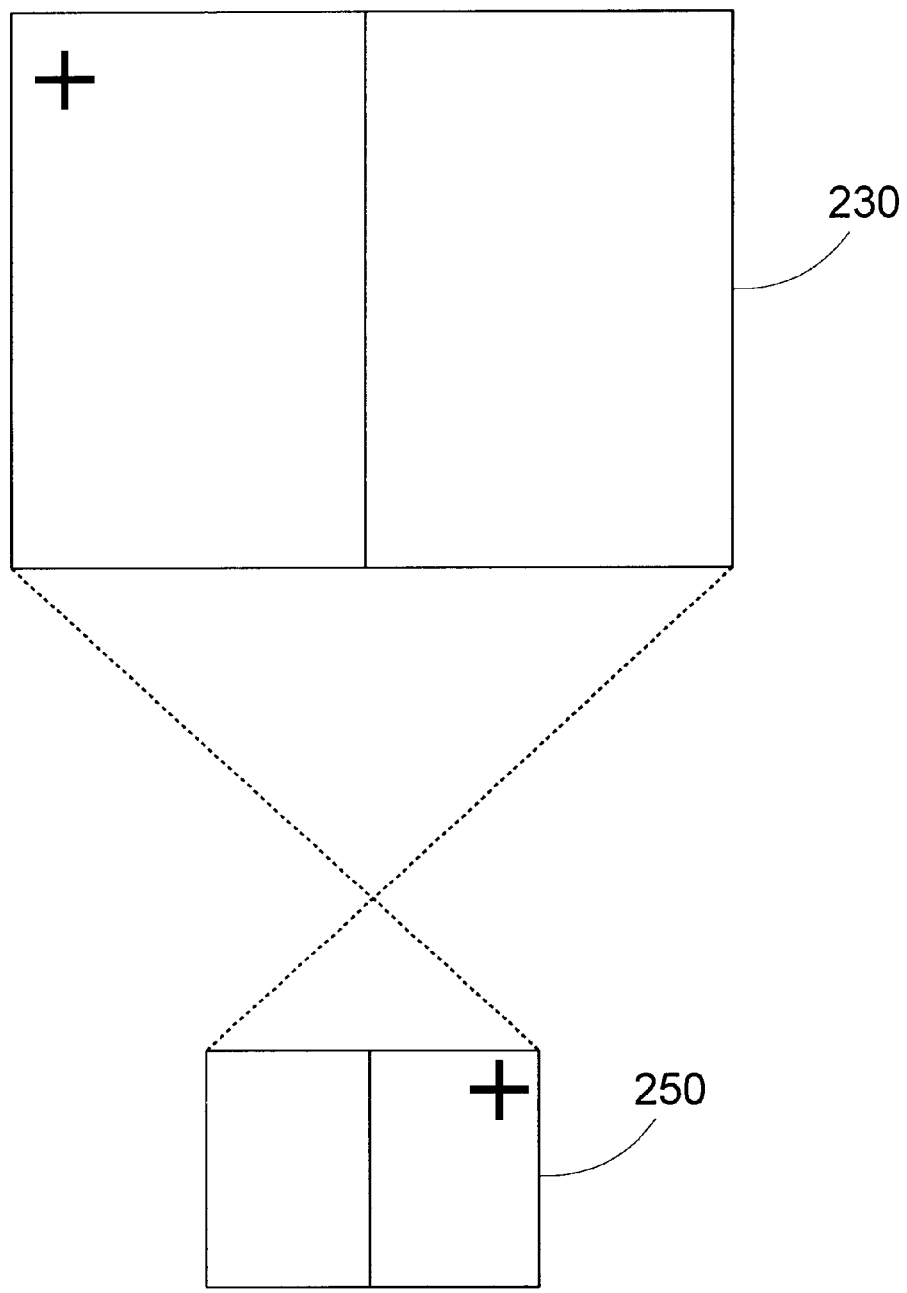
FIG. 5 illustrates, in further detail, one embodiment of implementing latency time into the manufacturing model described in FIG. 4.

Turning now to FIG. 5, one embodiment of the basis for modifying the control input parameters to include a latency time parameter is described. Error data associated with the processing of semiconductor wafers is calculated, as described in block 510. The error data is acquired from one of a plurality of methods known by those skilled in the art. Once the error data is acquired, a determination is made whether the error data is inside the deadband, as described in block 520 of FIG. 5. The step described in block 520 is performed to determine whether an error is sufficiently significant to warrant a change in the control inputs on the line 120. To define the deadband, the errors acquired from product analysis stations (not shown), such as the review station, are compared to a predetermined set of threshold parameters. In one embodiment, the deadband contains a range of error values associated with control input signals centered proximate to a set of corresponding predetermined target values, for which generally controller action is blocked. If any one of the errors acquired from the product analysis station is smaller than its corresponding predetermined threshold value, that particular error is deemed to be in the deadband. One of the primary purposes of the deadband is to prevent excessive control actions, resulting from changes to control input parameters on the line 120, from causing a semiconductor manufacturing process to be inordinately jittery.

When a determination is made, as shown in block 520, that an error corresponding to a control input signal is inside the deadband, that particular error is ignored, as described in block 530 of FIG. 5. Therefore, when the value of an error that corresponds to a control input signal is found to be in the predetermined deadband, that particular error is not used to update its corresponding control input signal. In one embodiment, when the error data is determined to be inside the deadband, no changes to the control parameters are made based upon that particular error data. New error data is then obtained and analyzed, as described in block 540 of FIG. 5. In one embodiment, the steps described above are repeated for the new error data that is obtained.

When a determination is made, as shown in block 520, that an error corresponding to a control input signal is not inside the deadband, further processing, such as modifying the control input parameters by using latency data to compensate for the errors, is performed, as described in block 550 of FIG. 5. Using the value of the error corresponding to a control input signal and latency data, the control input parameters on the line 120 are modified for use during a subsequent manufacturing process step.

The principles taught by the present invention can be implemented in an Advanced Process Control (APC) framework. The APC framework is a preferred platform from which to implement the overlay control strategy taught by the present invention. In some embodiments, the APC framework can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

processing semiconductor devices;

acquiring metrology data from said processed semiconductor devices;

performing a latency analysis process using said acquired metrology data, performing said latency analysis comprising calculating a latency time period between at least two processing steps; and performing a feedback/feed-forward modification process in response to said latency analysis process.

2. The method described in claim 1, wherein said processing of semiconductor devices further comprises processing semiconductor wafers.

3. The method described in claim 2, wherein performing a latency analysis process further comprises:

collecting manufacturing data from at least two processing steps;

calculating a latency time period between said two processing steps;

implementing said latency time period into a manufacturing model that controls said processing of semiconductor wafers; and modifying at least one control input parameter that controls said processing of semiconductor wafers in response to said implementation of said latency time period into said manufacturing model.

4. The method described in claim 3, wherein modifying at least one control input parameter further comprises:

calculating a manufacturing error data using said metrology data;

determining whether said error data are inside a deadband; and modifying at least one control input parameter using said latency time period based upon a determination that said error data are not inside said deadband.

5. The method described in claim 4, wherein modifying at least one control input parameter further comprises modifying at least one control input parameter on a run-to-run basis.

6. The method described in claim 1, wherein performing a feedback/feed-forward modification process further comprises modifying exposure dosages in a photolithography process.

7. The method described in claim 1, wherein performing a feedback/feed-forward modification process further comprises modifying exposure focus in a photolithography process.

8. The method described in claim 1, wherein performing a feedback/feed-forward modification process further comprises modifying etch recipe modification in an etch process.

9. The method described in claim 1, wherein performing a feedback/feed-forward modification process comprises performing a feedback process using an Advanced Process Controller (APC).

10. The method described in claim 1, wherein performing a feedback/feed-forward modification process further comprises modifying a deposition time period to adjust a spacer width during a spacer deposition process.

11. The method described in claim 1, wherein performing a feedback/feed-forward modification process further comprises making adjustments to an ion implant dosage during an ion implant process.

12. The method described in claim 1, wherein performing a feedback/feed-forward modification process further comprises performing a feed-forward process using an Advanced Process Controller (APC).

13. An apparatus, comprising:

a computer system;

a manufacturing model coupled with said computer system, said manufacturing model for generating and modifying at least one control input parameter signal;

a machine interface coupled with said manufacturing model, said machine interface for receiving process recipes from said manufacturing model;

at least one processing tool for processing semiconductor wafers and coupled with said machine interface, said processing for receiving at least one control input parameter signal from said machine interface;

a metrology tool coupled with said processing tool, said metrology tool for acquiring metrology data;

a metrology data processing unit coupled with said metrology tool, said metrology data processing unit for organizing said acquired metrology data;

a latency calculator coupled with said metrology tool, said latency calculator for calculating a latency time period between a plurality of semiconductor wafer manufacturing processes based upon said metrology data; and a feedback/feed-forward controller coupled with said latency calculator and said computer system, wherein said feedback/feed-forward controller for generating feedback and feed-forward adjustment data and sending them to said computer system for modification of control system parameters.

14. The apparatus of claim 13, wherein said computer system generates modification data for modifying at least one control input parameter.

15. The apparatus of claim 14, wherein said manufacturing model modifies said control input parameter in response to said modification data.

16. An apparatus, comprising:

means for processing semiconductor devices;

means for acquiring metrology data from said processed semiconductor devices;

means for performing a latency analysis process using said acquired metrology data, performing said latency analysis comprising calculating a latency time period between at least two processing steps; and means for performing a feedback/feed-forward modification process in response to said latency analysis process.

17. A computer readable program storage device encoded with instructions that, when executed by a computer, performs a method, comprising:

processing semiconductor devices;

acquiring metrology data from said processed semiconductor devices;

performing a latency analysis process using said acquired metrology data, performing said latency analysis comprising calculating a latency time period between at least two processing steps; and performing a feedback/feed-forward modification process in response to said latency analysis process.

18. The computer readable program storage device encoded with instructions that, when executed by a computer, performs the method described in claim 17, wherein said processing of semiconductor devices further comprises processing semiconductor wafers.

19. The computer readable program storage device encoded with instructions that, when executed by a computer, performs the method described in claim 18, wherein performing a latency analysis process further comprises:

collecting manufacturing data from at least two processing steps;

calculating a latency time period between said two processing steps;

implementing said latency time period into a manufacturing model that controls said processing of semiconductor wafers; and modifying at least one control input parameter that controls said processing of semiconductor wafers in response to said implementation of said latency time period into said manufacturing model.

20. The computer readable program storage device encoded with instructions that, when executed by a computer, performs the method described in claim 19, wherein modifying at least one control input parameter further comprises modifying at least one control input parameter on a run-to-run basis.

21. The computer readable program storage device encoded with instructions that, when executed by a computer, performs the method described in claim 19, wherein modifying at least one control input parameter further comprises:

calculating a manufacturing error data using said metrology data;

determining whether said error data are inside a deadband; and modifying at least one control input parameter using said latency time period based upon a determination that said error data are not inside said deadband.

22. The computer readable program storage device encoded with instructions that, when executed by a computer, performs the method described in claim 17, wherein performing a feedback/feed-forward modification process further comprises modifying exposure dosages in a photolithography process.

23. The computer readable program storage device encoded with instructions that, when executed by a computer, performs the method described in claim 17, wherein performing a feedback/feed-forward modification process further comprises modifying exposure focus in a photolithography process.

24. The computer readable program storage device encoded with instructions that, when executed by a computer, performs the method described in claim 17, wherein performing a feedback/feed-forward modification process further comprises modifying an etch recipe in an etch process.

25. The computer readable program storage device encoded with instructions that, when executed by a computer, performs the method described in claim 17, wherein performing a feedback/feed-forward modification process comprises performing a feedback process using an Advanced Process Controller (APC).

26. The computer readable program storage device encoded with instructions that, when executed by a computer, performs the method described in claim 17, wherein performing a feedback/feed-forward modification process further comprises modifying a deposition time period to adjust a spacer width during a spacer deposition process.

27. The computer readable program storage device encoded with instructions that, when executed by a computer, performs the method described in claim 17, wherein performing a feedback/feed-forward modification process further comprises making adjustments to an ion implant dosage during an ion implant process.

28. The computer readable program storage device encoded with instructions that, when executed by a computer, performs the method described in claim 17, wherein performing a feedback/feed-forward modification process further comprises performing a feed-forward process using an Advanced Process Controller (APC).

29. A system, comprising:

a first processing tool for performing a first processing step upon semiconductor devices;

a second processing tool for performing a second processing step upon said semiconductor devices;

a controller operatively, coupled to said first and second processing tools, said controller for performing a latency analysis process, wherein performing said latency analysis comprising calculating a latency time period between said first processing step and said second processing step, and performing a feedback/feed-forward modification process based upon said latency time period.

30. The system of claim 29, further comprising:

a computer system;

a manufacturing model coupled with said computer system, said manufacturing model for generating and modifying at least one control input parameter signal;

a machine interface coupled with said manufacturing model, said machine interface for receiving process recipes from said manufacturing model;

a metrology tool coupled with at least one of said first and second processing tools, said metrology tool for acquiring metrology data;

a metrology data processing unit coupled with said metrology tool, said metrology data processing unit for organizing said acquired metrology data;

a latency calculator coupled with said metrology tool, said latency calculator for calculating a latency time period between a plurality of semiconductor wafer manufacturing processes based upon said metrology data; and a feedback/feed-forward controller coupled with said latency calculator and said computer system, wherein said feedback/feed-forward controller for generating feedback and feed-forward adjustment data and sending them to said computer system for modification of control system parameters.

* * * * *

UNITED STATES PATENT AND TRADEMARK OFFICE
CERTIFICATE OF CORRECTION

PATENT NO.    : 6,571,371 B1                                                             Page 1 of 1
DATED         : May 27, 2003
INVENTOR(S)   : Elfido Coss et al.

It is certified that error appears in the above-identified patent and that said Letters Patent is hereby corrected as shown below:

Column 6,
Line 39, replace "ti" with -- $t_1$ --.

Signed and Sealed this

Ninth Day of September, 2003

JAMES E. ROGAN
*Director of the United States Patent and Trademark Office*